(12) United States Patent
Lee

(10) Patent No.: US 12,069,927 B2
(45) Date of Patent: Aug. 20, 2024

(54) DISPLAY APPARATUS INCLUDING QUANTUM DOT

(71) Applicant: SAMSUNG DISPLAY CO., LTD., Yongin-si (KR)

(72) Inventor: Minsu Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 442 days.

(21) Appl. No.: 17/462,499

(22) Filed: Aug. 31, 2021

(65) Prior Publication Data

US 2022/0165802 A1 May 26, 2022

(30) Foreign Application Priority Data

Nov. 25, 2020 (KR) .................. 10-2020-0160442

(51) Int. Cl.
*H10K 59/38* (2023.01)
*H10K 59/12* (2023.01)
*H10K 102/00* (2023.01)

(52) U.S. Cl.
CPC ............. *H10K 59/38* (2023.02); *H10K 59/12* (2023.02); *H10K 2102/331* (2023.02)

(58) Field of Classification Search
CPC . H10K 59/38; H10K 2102/331; H10K 50/115
See application file for complete search history.

(56) References Cited

U.S. PATENT DOCUMENTS

| 11,011,587 | B2 | 5/2021 | Lee et al. | |
| 2011/0248256 | A1* | 10/2011 | Cok | H10K 50/865 257/40 |
| 2015/0293280 | A1* | 10/2015 | Lee | G02B 5/223 359/891 |
| 2017/0102487 | A1 | 4/2017 | Lee et al. | |
| 2018/0100956 | A1* | 4/2018 | Lee | G02B 5/204 |
| 2018/0143497 | A1 | 5/2018 | Kim et al. | |
| 2020/0388653 | A1* | 12/2020 | Lee | H10K 59/40 |
| 2021/0408496 | A1* | 12/2021 | Choi | H10K 50/86 |

FOREIGN PATENT DOCUMENTS

| KR | 101110364 B1 | 1/2012 |
| KR | 1020170041951 A | 4/2017 |
| KR | 1020180056443 A | 5/2018 |
| KR | 102064326 B1 | 1/2020 |
| KR | 1020200140438 A | 12/2020 |

* cited by examiner

*Primary Examiner* — Nduka E Ojeh
(74) *Attorney, Agent, or Firm* — CANTOR COLBURN LLP

(57) ABSTRACT

A display apparatus includes a first pixel, a second pixel, and a third pixel that emit light of different colors, a first quantum conversion layer arranged corresponding to an emission area of the first pixel and including first quantum dots and first metal nanoparticles, and a second quantum conversion layer arranged corresponding to an emission area of the second pixel and including second quantum dots and second metal nanoparticles, where the plurality of first quantum dots has an average size different from an average size of the second quantum dots, and the first metal nanoparticles have an average size identical to an average size of the plurality of second metal nanoparticles, and outer shapes of the first metal nanoparticles and the second metal nanoparticles have sharper corners than virtual outer spherical shapes.

20 Claims, 20 Drawing Sheets

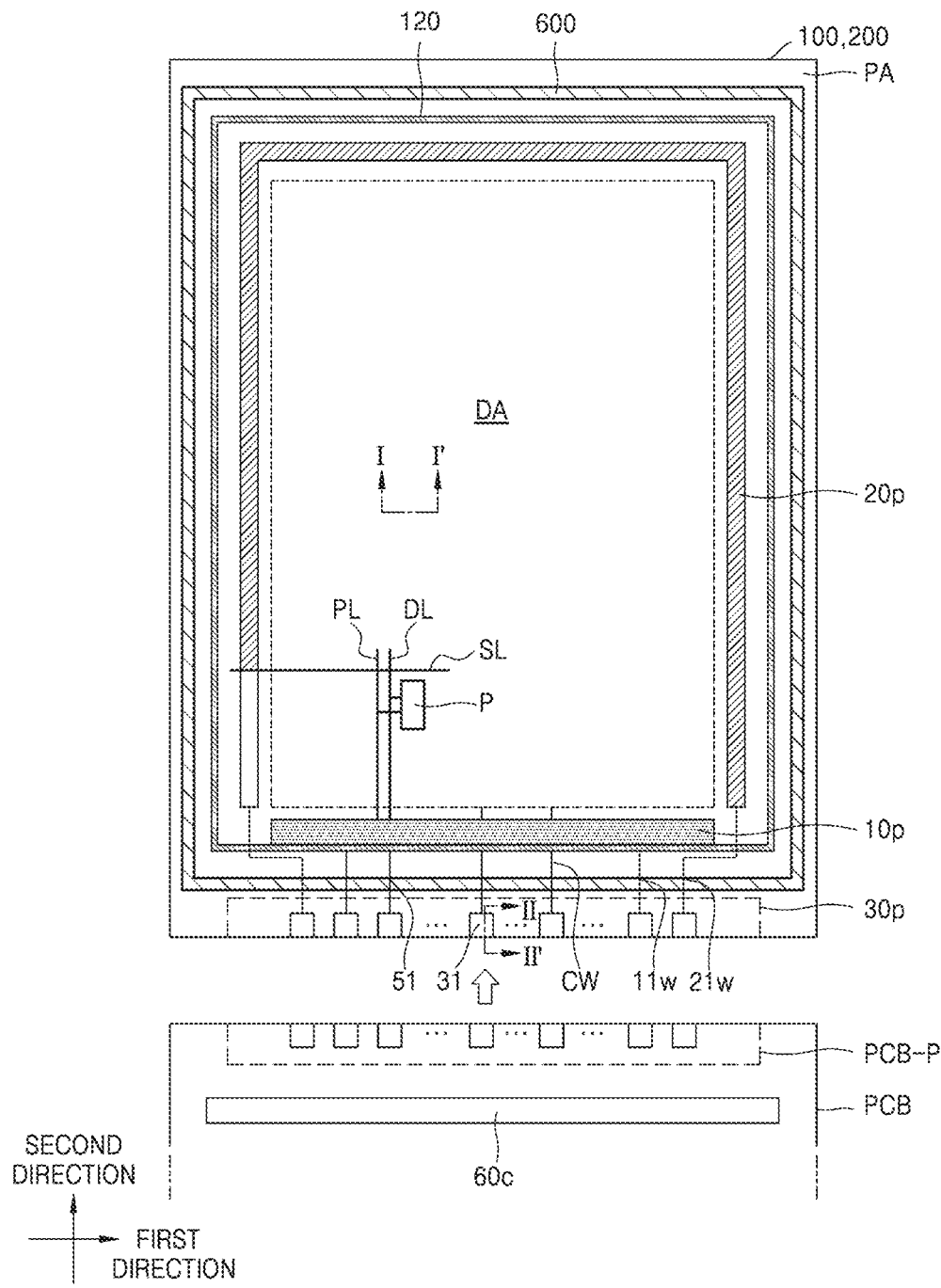

FIG. 6
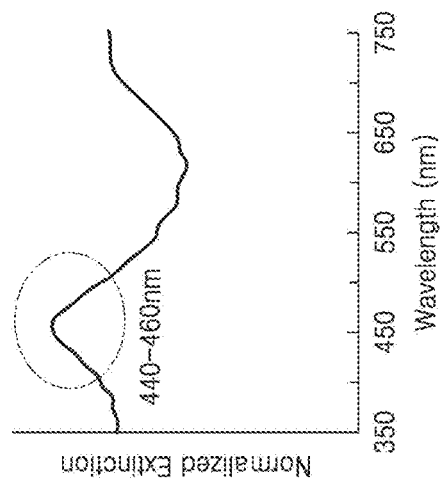
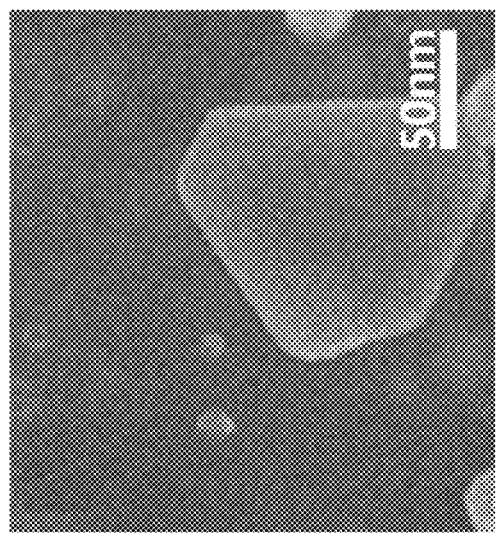

DISPLAY APPARATUS INCLUDING QUANTUM DOT

This application claims priority to Korean Patent Application No. 10-2020-0160442, filed on Nov. 25, 2020, and all the benefits accruing therefrom under 35 U.S.C. § 119, the content of which in its entirety is herein incorporated by reference.

BACKGROUND

1. Field

One or more embodiments relate to a display apparatus.

2. Description of the Related Art

A display apparatus visually displays data. Such a display apparatus includes a substrate including a display area and a peripheral area. In the display area, scan lines and data lines are formed insulated from each other and pixels are arranged therein. Also, in the display area, a thin film transistor ("TFT") and a pixel electrode electrically connected to the TFT are arranged corresponding to each pixel. Also, an opposite electrode that is commonly included in the pixels may be located in the display area. In the peripheral area, lines which transmit electrical signals to the display area, a scan driver, a data driver, a controller, a pad unit, and the like may be arranged.

Display apparatuses are used in various fields. Accordingly, various designs for improving the quality of display apparatuses are being attempted.

SUMMARY

One or more embodiments provide a display apparatus for realizing high-quality images in a display area. However, this is merely an example, and the invention is not limited thereto.

Additional features will be set forth in part in the description which follows and, in part, will be apparent from the description, or may be learned by practice of the presented embodiments of the invention.

An embodiment of the invention provides a display apparatus including a first pixel, a second pixel, and a third pixel that emit light of different colors, a first quantum conversion layer arranged corresponding to an emission area of the first pixel and including first quantum dots and first metal nanoparticles, and a second quantum conversion layer arranged corresponding to an emission area of the second pixel and including second quantum dots and second metal nanoparticles, where the plurality of first quantum dots has an average size different from an average size of the second quantum dots, and the first metal nanoparticles have an average size identical to an average size of the plurality of second metal nanoparticles, and outer shapes of the first metal nanoparticles and the second metal nanoparticles have sharper corners than virtual outer spherical shapes.

In an embodiment, the display apparatus may further include a first color filter arranged corresponding to the first pixel, a second color filter arranged corresponding to the second pixel, and a third color filter arranged corresponding to the third pixel, where the first, second, and third color filters may emit light of different colors.

In an embodiment, the display apparatus may further include a substrate and an opposite substrate arranged corresponding to the substrate and including a polarization layer.

In an embodiment, the display apparatus may further include a thin film encapsulation layer covering the first pixel, the second pixel, and the third pixel and including at least one inorganic encapsulation layer and at least one organic encapsulation layer, and a touch screen layer arranged on a surface of the thin film encapsulation layer facing the first and second quantum conversion layers.

In an embodiment, the first pixel may display a color of a longer wavelength than a color of the second pixel, and the average size of the plurality of first quantum dots may be greater than the average size of the plurality of second quantum dots.

In an embodiment, the plurality of first metal nanoparticles and the plurality of second metal nanoparticles may have polygonal shapes with rounded corners.

In an embodiment, the plurality of first metal nanoparticles and the plurality of second metal nanoparticles may have a star, a crescent moon, a nanorod, a hollow nanocage, or an oval shape.

In an embodiment, the plurality of first metal nanoparticles and the plurality of first quantum dots may be arranged apart from each other, and the plurality of second metal nanoparticles and the plurality of second quantum dots may be arranged apart from each other.

In an embodiment, graft molecules may be further arranged on surfaces of the plurality of first metal nanoparticles and the plurality of second metal nanoparticles.

In an embodiment, the plurality of first metal nanoparticles and the plurality of second metal nanoparticles may each include at least one of Au, Ag, Al, $Al_2O_3$, Co, Cu, Cr, Pt, Ni, Fe, Mo, and W.

In an embodiment, the display apparatus may further include a third quantum conversion layer arranged corresponding to the third pixel and including a plurality of third quantum dots and a plurality of third metal nanoparticles, where an average size of the plurality of third quantum dots may be different from the average size of the plurality of first quantum dots and the average size of the plurality of second quantum dots, and an average size of the plurality of third metal nanoparticles may be the same as the average size of the plurality of first metal nanoparticles and the average size of the plurality of second metal nanoparticles.

In an embodiment, the first pixel, the second pixel, and the third pixel may each include an organic light-emitting diode.

In an embodiment, the organic light-emitting diodes of the first, second, and third pixels may emit blue light.

An embodiment of the invention provides a display apparatus including a first pixel, a second pixel, and a third pixel arranged on a substrate and respectively including organic light-emitting diodes that emit a same color light, a thin film encapsulation layer covering the organic light-emitting diodes, and a transmission window arranged on the thin film encapsulation layer and corresponding to the first quantum conversion layer corresponding to the first pixel, the second quantum conversion layer corresponding to the second pixel, and the third pixel, where the first quantum conversion layer includes a plurality of first quantum dots and a plurality of first metal nanoparticles, the second quantum conversion layer includes a plurality of second quantum dots having an average size different from an average size of the plurality of first quantum dots, and a plurality of second metal nanoparticles having an average size the same as an average size of the plurality of first metal nanoparticles within an error range, and outer shapes of the plurality of first metal nanoparticles and the plurality of second metal nanoparticles have sharper corners than virtual outer spherical shapes.

In an embodiment, the organic light-emitting diodes of the first, second, and third pixels may emit blue light.

In an embodiment, the thin film encapsulation layer may include at least one inorganic encapsulation layer and at least one organic encapsulation layer.

In an embodiment, the plurality of first metal nanoparticles and the plurality of second metal nanoparticles may include silver (Ag) and have triangular shapes.

In an embodiment, the transmission window may include scattered particles.

In an embodiment, the display apparatus further may include a touch conductive layer may be further arranged on a surface of the thin film encapsulation layer facing the first and second quantum conversion layers.

In an embodiment, the display apparatus may further include a first color filter arranged corresponding to the first quantum conversion layer, a second color filter arranged corresponding to the second quantum conversion layer, and a third color filter arranged corresponding to the transmission window.

BRIEF DESCRIPTION OF THE DRAWINGS

The above and other embodiments, features, and advantages of embodiments of the invention will be more apparent from the following description taken in conjunction with the accompanying drawings, in which:

FIG. 1 is a schematic plan view of an embodiment of a display apparatus;

FIGS. 5 and 6 illustrate an embodiment of a change in photon extinction characteristics, according to shapes of metal nanoparticles;

DETAILED DESCRIPTION

Figure 2A:
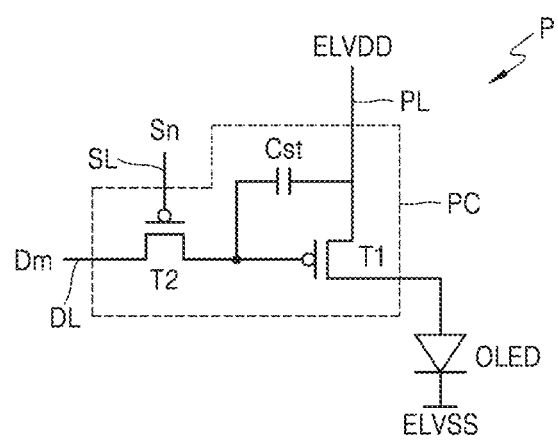
FIG. 2A is an equivalent circuit diagram of an embodiment of a pixel included in the display apparatus of FIG. 1.

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. The attached drawings for illustrating preferred embodiments of the disclosure are referred to in order to gain a sufficient understanding of the disclosure, the merits thereof, and the objectives accomplished by the implementation of the disclosure. The disclosure may, however, be embodied in many different forms and should not be construed as being limited to the embodiments set forth herein.

The disclosure will now be described more fully with reference to the accompanying drawings, in which embodiments of the disclosure are shown. Like reference numerals in the drawings denote like elements, and thus their description will be omitted.

It will be understood that although the terms "first," "second," etc., may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms comprises and/or comprising used herein specify the presence of stated features or components, but do not preclude the presence or addition of one or more other features or components.

It will be understood that when a layer, region, or component is referred to as being "disposed on" another layer, region, or component, it can be directly or indirectly disposed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

It will be understood that when a component, such as a layer, a film, a region, or a plate, is also referred to as being "connected to" another component, the component can be directly connected to the other component or intervening components may be therebetween. It will be understood that when a component, such as a layer, a film, a region, or a plate, is referred to as being "electrically connected to" another component, the component can be directly electrically connected to the other component or intervening components may be therebetween for indirect electrical connection.

A display apparatus displays an image, and examples of the display apparatus may include an organic light emitting display apparatus, an inorganic light emitting display apparatus, a quantum dot light emitting display apparatus, a field emission display apparatus, a surface-conduction electron-emitter display apparatus, a plasma display apparatus, and the like.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Hereinafter, an organic light-emitting display apparatus is described as the display apparatus in an embodiment, but the invention is not limited thereto. Various display apparatuses may be used.

FIG. 1 is a schematic plan view of an embodiment of a display apparatus.

Referring to FIG. 1, the display apparatus may be provided as a substrate 100 and an upper substrate 200 adhere to each other by a sealing member 600. The sealing member 600 may surround peripheries of the substrate 100 and the upper substrate 200 and may seal the substrate 100 to the upper substrate 200.

The display apparatus includes a display area DA and a peripheral area PA outside the display area DA. The display apparatus may provide a predetermined image by light emitted from pixels arranged in the display area DA.

The display area DA includes pixels P connected to data lines DL extending in a second direction and scan lines SL extending in a first direction crossing the second direction. Each pixel P is connected to a driving power line PL extending in the second direction.

Each pixel P may include a display device such as an organic light-emitting diode OLED. Each pixel P may emit, for example, red light, green light, blue light, or white light from the organic light-emitting diode OLED. In the specification, the pixel P may be understood as a sub-pixel emitting any one of red light, green light, blue light, and white light, as described above. In some embodiments, the organic light-emitting diodes OLED included in the pixels P may emit light of the same color, and colors of the pixels P may be realized by color filters, etc., arranged on the organic light-emitting diodes OLED.

Each pixel P may be electrically connected to embedded circuits arranged in the peripheral area PA. In the peripheral area PA, a first power supply line 10p, a second power supply line 20p, and a pad unit 30p may be arranged.

The first power supply line 10p may correspond to one side of the display area DA. The first power supply line 10p may be connected to the driving power lines PL which transmit a driving voltage ELVDD (refer to FIGS. 2A and 2B) to the pixels P.

The second power supply line 20p may have a loop shape of which one side is open and may partially surround the display area DA. The second power supply line 20p may supply a common voltage to an opposite electrode of the pixel P. The second power supply line 20p may be also referred to as a common voltage supply line.

The pad unit 30p may include multiple pads 31 and may be arranged on one side of the substrate 100. Each pad 31 may be connected to a first connection wire 11w connected to the first power supply line 10p, connection wires CW extending to the display area DA, or the like. The pads 31 of the pad unit 30p may be exposed by not being covered by an insulating layer, and thus may be electrically connected to a printed circuit board PCB. A printed circuit board terminal PCB-P of the printed circuit board PCB may be electrically connected to the pad unit 30p.

The printed circuit board PCB transmits a signal of a controller (not shown) or power to the pad unit 30p. The controller may respectively provide a driving voltage ELVDD and a common voltage ELVSS (refer to FIGS. 2A and 2B) to the first and second power supply lines 10p and 20p through the first connection wire 11w and a second connection wire 21w.

A data driving circuit 60c is electrically connected to the data line DL. A data signal from the data driving circuit 60c may be provided to each pixel P through the connection wire CW connected to the pad unit 30p and the data line DL connected to the connection wire CW. FIG. 1 illustrates that the data driving circuit 60c is arranged on the printed circuit board PCB, but in another embodiment, the data driving circuit 60c may be arranged on the substrate 100. In an embodiment, the data driving circuit 60c may be arranged between the pad unit 30p and the first power supply line 10p, for example.

In the peripheral area PA, a dam portion 120 may be disposed. When an organic encapsulation layer 420 (refer to FIGS. 3AA and 3BA) of a thin film encapsulation layer 400 is provided, the dam portion 120 may prevent an organic material from flowing in a direction towards an edge of the substrate 100, and thus, the formation of edge tails of the organic encapsulation layer 420 may be prevented. In the peripheral area PA, the dam portion 120 may surround at least a portion of the display area DA. The dam portion 120 may include dams, and when the dams are arranged, respective dams may be apart from one another. In the peripheral area PA, the dam portion 120 may be closer to the display area DA than the sealing member 600 is to the display area DA. In the peripheral area PA, an embedded driving circuit (not shown) which provides a scan signal of each pixel may be further included. In some embodiments, the embedded driving circuit and the dam portion 120 may overlap each other.

Figure 2B:
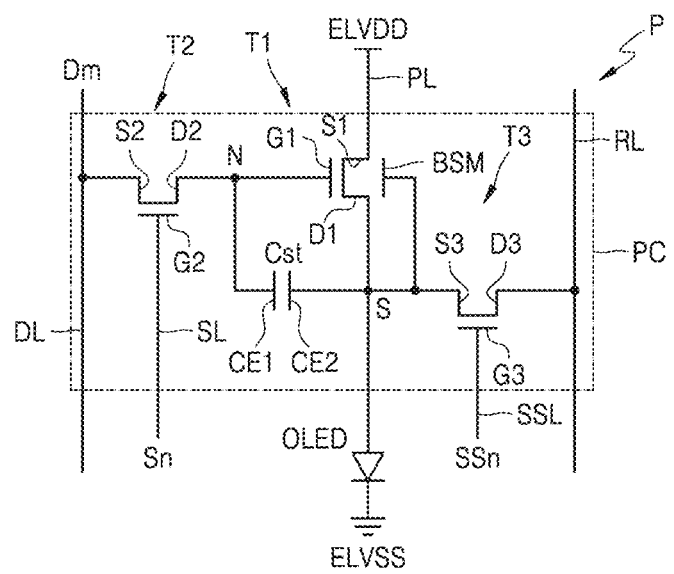
FIG. 2B is an equivalent circuit diagram of an embodiment of a pixel included in the display apparatus of FIG. 1.

FIGS. 2A and 2B are equivalent circuit diagrams of an embodiment of any one of pixels included in a display apparatus.

Referring to FIG. 2A, each pixel P includes a pixel circuit PC, which is connected to the scan line SL and the data line DL, and the organic light-emitting diode OLED connected to the pixel circuit PC.

The pixel circuit PC includes a driving thin film transistor ("TFT") T1, a switching TFT T2, and a storage capacitor Cst. The switching TFT T2 is connected to the scan line SL and the data line DL and transmit a data signal Dm, which is input through the data line DL, to the driving TFT T1 in response to a scan signal Sn that is input through the scan line SL. Here, n and m may be natural numbers.

The storage capacitor Cst is connected to the switching TFT T2 and the driving power line PL and stores a voltage corresponding to a difference between a voltage from the switching TFT T2 and a first power voltage ELVDD (or a driving voltage) provided to the driving power line PL.

The driving TFT T1 is connected to the driving power line PL and the storage capacitor Cst and controls a driving current, which flows in the organic light-emitting diode OLED from the driving power line PL, corresponding to the voltage stored in the storage capacitor Cst. The organic light-emitting diode OLED may emit light having predetermined brightness, according to the driving current.

FIG. 2A illustrates that the pixel circuit PC includes two TFTs and one storage capacitor, but the invention is not limited thereto.

Referring to FIG. 2B, each pixel P may include the organic light-emitting diode OLED and the pixel circuit PC including TFTs driving the organic light-emitting diode OLED. The pixel circuit PC may include the driving TFT T1, the switching TFT T2, a sensing TFT T3, and the storage capacitor Cst.

A gate electrode G2 of the switching TFT T2 may be connected to the scan line SL, a source electrode S2 of the switching TFT T2 may be connected to the data line DL, and a drain electrode D2 of the switching TFT T2 may be connected to a first electrode CE1 of the storage capacitor Cst.

Accordingly, the switching TFT T2 provides a data voltage of the data line DL to a first node N in response to the scan signal Sn from the scan line SL of each pixel P.

A gate electrode G1 of the driving TFT T1 may be connected to the first node N, a source electrode S1 of the driving TFT T1 may be connected to the driving power line PL which transmits the driving voltage ELVDD, and a drain electrode D1 of the driving TFT T1 may be connected to an anode of the organic light-emitting diode OLED.

Accordingly, the driving TFT T1 may adjust the amount of current flowing in the organic light-emitting diode OLED, according to a voltage between the source and gate electrodes S1 and G1 of the driving TFT T1, that is, the driving voltage ELVDD and a voltage applied to the first node N.

A gate electrode G3 of the sensing TFT T3 is connected to a sensing control line SSL, a source electrode S3 of the sensing TFT T3 is connected to a second node S, and a drain electrode D3 of the sensing TFT T3 is connected to a reference voltage line RL. In some embodiments, the sensing TFT T3 may be controlled by the scan line SL instead of the sensing control line SSL.

The sensing TFT T3 may sense a potential of a pixel electrode (e.g., an anode) of the organic light-emitting diode OLED. The sensing TFT T3 provides a pre-charging voltage, which is provided from the reference voltage line RL, to the second node S in response to a sensing signal SSn from the sensing control line SSL and provide a voltage of the pixel electrode (e.g., the anode) of the organic light-emitting diode OLED to the reference voltage line RL during a sensing period.

The first electrode CE1 of the storage capacitor Cst is connected to the first node N, and a second electrode CE2 of the storage capacitor Cst is connected to the second node S. The storage capacitor Cst charges a voltage corresponding to a difference between voltages respectively provided to the first node N and the second node S and provides the charged voltage as a driving voltage of the driving TFT T1. In an embodiment, the storage capacitor Cst may charge a voltage corresponding to a difference between a data voltage Dm and a pre-charging voltage that are respectively provided to the first node N and the second node S, for example.

A bias electrode BSM may correspond to the driving TFT T1 and may be connected to the source electrode S3 of the sensing TFT T3. The bias electrode BSM may receive a voltage in synchronization with a potential of the source electrode S3 of the sensing TFT T3, and thus, the driving TFT T1 may be stabilized. In some embodiments, the bias electrode BSM may not be connected to the source electrode S3 of the sensing TFT T3 and may be connected to a separate bias line.

An opposite electrode (e.g., a cathode) of the organic light-emitting diode OLED may receive the common voltage EVLSS. The organic light-emitting diode OLED receives the driving current from the driving TFT T1 and emits light.

FIG. 2B illustrates that each pixel P includes the scan line SL, the sensing control line SSL, and the data line DL, the reference voltage line RL, and the driving voltage line PL, but the invention is not limited thereto. In an embodiment, at least one of the scan line SL, the sensing control line SSL, and the data line DL and/or the reference voltage line RL and the driving voltage line PL may be shared by neighboring pixels, for example.

The pixel circuit PC is not limited to the number of TFTs, the number of storage capacitors, and a circuit design described with reference to FIGS. 2A and 2B, and the numbers and the circuit design may vary.

Figure 3A:
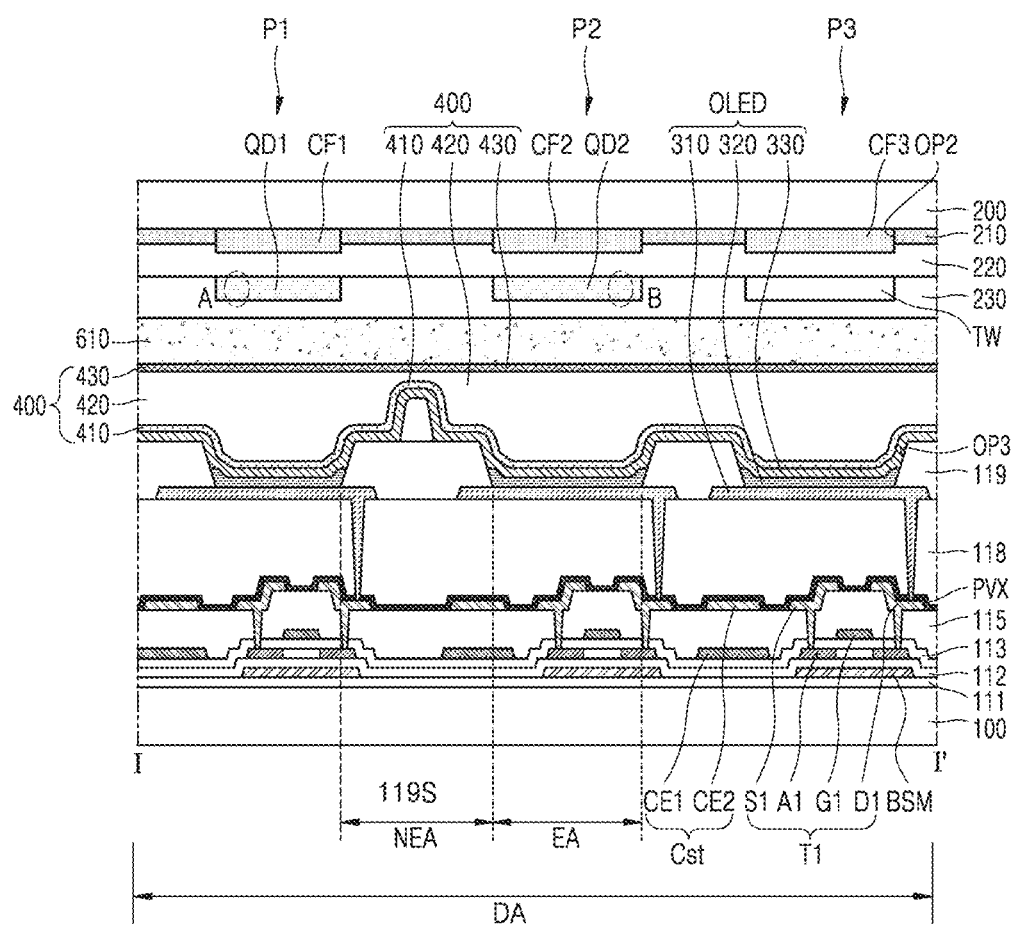
FIGS. 3AA and 3BA are schematic cross-sectional views of a display apparatus, FIGS. 3AB and 3AC are enlarged views of portions A and B of FIG. 3AA, respectively, and FIGS. 3BB to 3BD are enlarged views of portions A to C of FIG. 3BA, respectively.
Figure 3A:
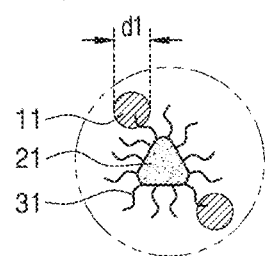
Figure 3A:
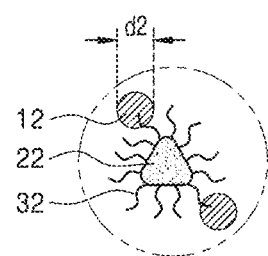
Figure 3B:
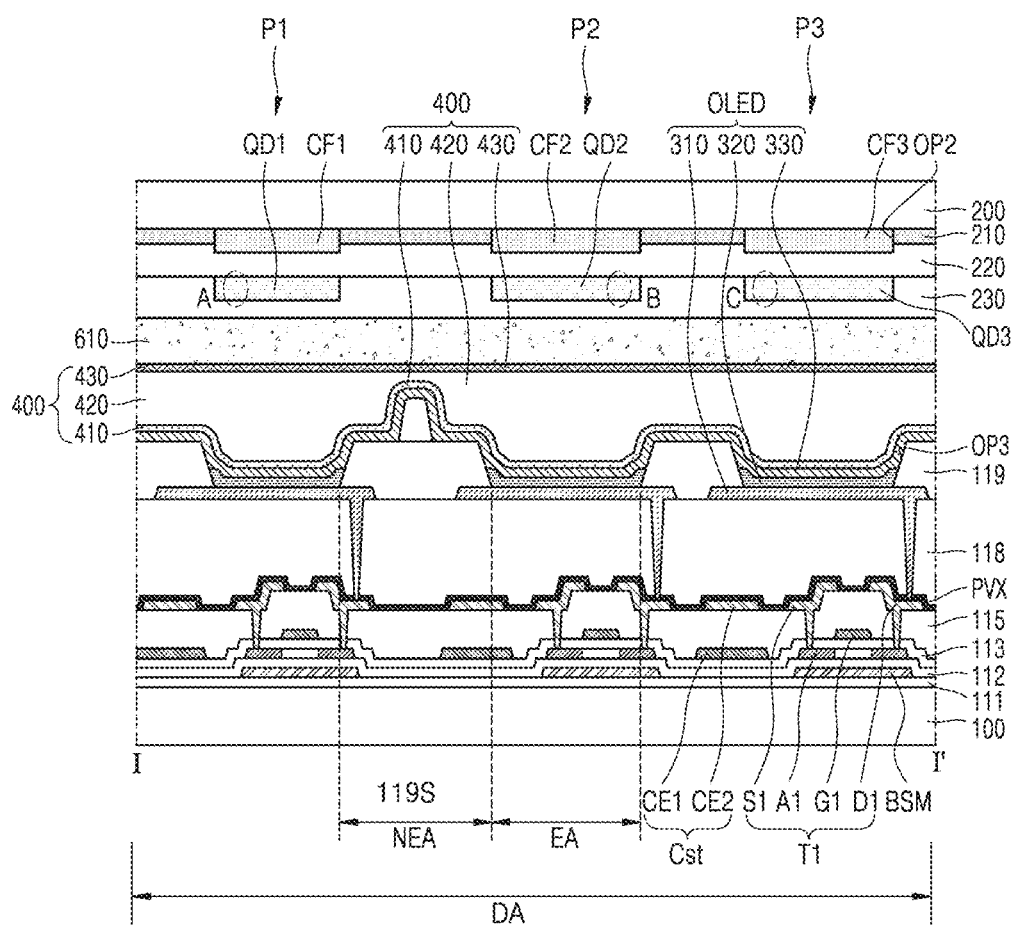
Figure 3B:
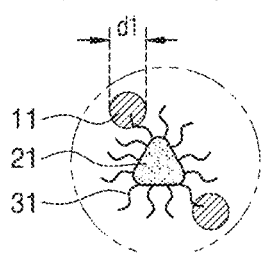
Figure 3B:
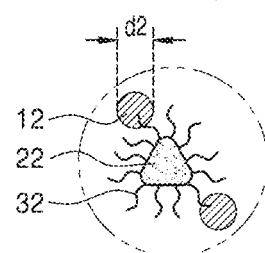
Figure 3B:
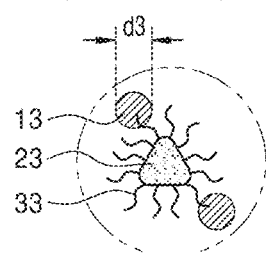
Figure 4:
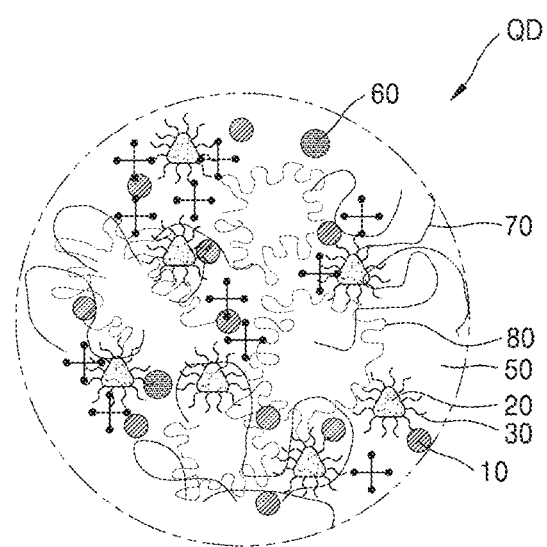
FIG. 4 is a schematic diagram of an embodiment of configurations that may be included in a quantum conversion layer.

FIGS. 3AA and 3BA are cross-sectional views illustrating a portion of the display area DA of the display apparatus according to one or more embodiments, taken along line I-I' of FIG. 1, FIGS. 3AB and 3AC are enlarged views of portions A and B of FIG. 3AA, respectively, and FIGS. 3BB to 3BD are enlarged views of portions A to C of FIG. 3BA, respectively. FIG. 4 is an enlarged view of a structure included in a quantum conversion layer of FIGS. 3AA and 3BA.

Referring to FIGS. 3AA and 3BA, in the display area DA of the display apparatus in an embodiment, at least one TFT T1 and a display element connected to the at least one TFT T1 may be arranged.

In the specification, the display area DA of the display apparatus includes pixels P1, P2, and P3, and each of the pixels P1, P2, and P3 includes an emission area EA. The emission area EA may be an area where light is generated and emitted to the outside. A non-emission area NEA may be arranged between the emission areas EA, and because of the non-emission area NEA, the emission areas EA of the pixels P1, P2, and P3 may be distinguished.

The first to third pixels P1 to P3 may emit light of different colors. In an embodiment, the first pixel P1 may emit red light, the second pixel P2 may emit green light, and the third pixel P3 may emit blue light, for example. In a plan view, the emission area EA of each pixel may have a polygonal shape, a circular shape, or the like, and arrangements thereof may vary, for example, may be a stripe arrangement, a pentile arrangement, and the like.

The display apparatus in the illustrated embodiment may include a quantum conversion layer corresponding to at least one pixel. In an embodiment, as illustrated in FIG. 3AA, a first quantum conversion layer QD1 and a second quantum conversion layer QD2 may correspond to the first pixel P1 and the second pixel P2, respectively, for example.

The first quantum conversion layer QD1 may include a first quantum dot 11 and a first metal nanoparticle 21, and the second quantum conversion layer QD2 may include a second quantum dot 12 and a second metal nanoparticle 22. Graft molecules 31 and 32 may be on surfaces of the first metal nanoparticle 21 and the second metal nanoparticle 22.

In the illustrated embodiment, an average size of the first quantum dots 11 included in the first quantum conversion layer QD1 and an average size of the second quantum dots 21 included in the second quantum conversion layer QD2 may be different from each other, and the first and second metal nanoparticles 21 and 22 may have multiple sides, for example, at least one corner. Also, an average size of the first metal nanoparticle 21 and an average size of the second metal nanoparticle 22 may be identical to each other. Detailed descriptions thereof will be provided below.

In FIG. 3AA, a quantum conversion layer may not correspond to the emission area EA of the third pixel P3, and a transmission window TW may be arranged in the emission area EA. The transmission window TW may include an organic material that enables the emission of light without a change in wavelengths of light emitted from the organic light-emitting diode OLED of the third pixel P3. In the transmission window TW, scattered particles may be distributed. Accordingly, light may be uniformly spread.

The organic light-emitting diodes OLED included in the first to third pixels P1 to P3 may emit light of the same color. In an embodiment, the organic light-emitting diode OLED may emit blue light. Accordingly, the first and second metal nanoparticles may have sizes in which extinction characteristics are maximized for the blue light, for example.

The first quantum conversion layer QD1 may emit red light because of the first quantum dots 11, and the second quantum conversion layer QD2 may emit green light because of the second quantum dots 12.

In an alternative embodiment, as illustrated in FIG. 3BA, the first quantum conversion layer QD1, the second quantum conversion layer QD2, and a third quantum conversion layer QD3 may correspond to the emission areas EA of the first to third pixels P1 to P3, respectively. The first to third quantum conversion layers QD1 to QD3 may include quantum dots and metal nanoparticles.

In an embodiment, the first to third quantum conversion layers QD1 to QD3 may include the first quantum conversion layer QD1 included in the first pixel P1, the second quantum conversion layer QD2 included in the second pixel P2, and the third quantum conversion layer QD3 included in the third pixel P3, for example. The first quantum conversion layer QD1 may include the first quantum dots 11 and the first metal nanoparticles 21, and the second quantum conversion layer QD2 may include the second quantum dots 12 and the second metal nanoparticles 22. Also, the third quantum conversion layer QD3 may include third quantum dots 13 and third metal nanoparticles 23. The graft molecules 31 and 32 and graft molecules 33 may be on surfaces of the first metal nanoparticles 21, the second metal nanoparticles 22, and the third metal nanoparticles 23

In the illustrated embodiment, an average size of the first quantum dots 11 included in the first conversion layer QD1, an average size of the second quantum dots 12 included in the second quantum conversion layer QD2, and an average size of the third quantum dots 13 included in the third quantum conversion layer QD3 may be different from one another, and the average size of the first metal nanoparticles 21, the average size of the second metal nanoparticles 22, and the average size of the third metal nanoparticles 23 may be identical to one another. Also, outer shapes of the first to third metal nanoparticles 21 to 23 may have sharp corners. That is, the outer shapes of the first to third metal nanoparticles 21 to 23 may have sharper corners than spherical or circular shapes. In an embodiment, the first to third metal nanoparticles 21 to 23 may include sides forming at least one corner, for example.

Hereinafter, the display apparatus in an embodiment will be described in detail according to a stack order illustrated in FIGS. 3AA and 3BA.

The driving TFT T1 of the pixel circuit PC of each pixel P and the storage capacitor Cst, which are described with reference to FIGS. 2A and 2B, are arranged in the display area DA of FIGS. 3AA and 3BA. For convenience of explanation, configurations arranged in the display area DA of FIGS. 3AA and 3BA will be described according to the stack order.

The substrate 100 may include a glass material, a ceramic material, a metal material, or a flexible or bendable material. In an embodiment, when the substrate 100 is flexible or bendable, the substrate 100 may include polymer resin such as polyether sulfone ("PES"), polyacrylate ("PAR"), polyetherimide ("PEI"), polyethylene naphthalate ("PEN"), polyethylene terephthalate ("PET"), polyphenylene sulfide ("PPS"), polyarylate, polyimide ("PI"), polycarbonate ("PC"), or cellulose acetate propionate ("CAP"). The substrate 100 may have a monolayer structure or a multilayered structure including the above material(s), and when the substrate 100 has the multilayered structure, the substrate 100 may further include an inorganic layer. In some embodiments, the substrate 100 may have a structure of an organic material/an inorganic material/an organic material.

A barrier layer (not shown) may be further arranged between the substrate 100 and a first buffer layer 111. The barrier layer may prevent or decrease the penetration of impurities from the substrate 100, etc., into a semiconductor layer A1. The barrier layer may include an inorganic material such as oxide or nitride, an organic material, or a composite of organic/inorganic materials and may have a monolayer structure or a multilayered structure including an inorganic material and an organic material.

The bias electrode BSM may be arranged on the first buffer layer 111 to correspond to the driving TFT T1. A voltage may be applied to the bias electrode BSM. In an embodiment, the bias electrode BSM may contact the source electrode S3 (refer to FIG. 2B) of the sensing TFT T3 (refer to FIG. 2B), and a voltage of the source electrode S3 may be applied to the bias electrode BSM, for example. Also, the bias electrode BSM may prevent external light from reaching the semiconductor layer A1. Accordingly, properties of the driving TFT T1 may be stabilized. The bias electrode BSM may be omitted in some cases.

The semiconductor layer A1 may be arranged on a second buffer layer 112. The semiconductor layer A1 may include amorphous silicon or polysilicon. In another embodiment, the semiconductor layer A1 may include oxide of at least one of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In some embodiments, the semiconductor layer A1 may include at least one of a zinc (Zn) oxide-based material, for example, zinc (Zn) oxide, indium (In)-zinc (Zn) oxide, gallium (Ga)-indium (In)-zinc (Zn) oxide, and the like. In another embodiment, the semiconductor layer A1 may be an indium (In)-gallium (Ga)-zinc (Zn)-oxide (O) ("IGZO"), indium (In)-tin (Sn)-zinc (Zn)-oxide (O) ("ITZO"), or indium (In)-gallium (Ga)-tin (Sn)-zinc (Zn)-oxide (O) ("IGTZO") semiconductor in which metal such as indium (In), gallium (Ga), or tin (Sn) is included in zinc oxide (ZnO). The semiconductor layer A1 may include a channel area and source and drain areas disposed on both sides of the channel area. The semiconductor layer A1 may be a layer or layers.

The gate electrode G1 is arranged on the semiconductor layer A1 to overlap at least a portion of the semiconductor layer A1 with a gate insulating layer 113 therebetween. The gate electrode G1 may include molybdenum (Mo), aluminum (Al), copper (Cu), titanium (Ti), or the like and may be a layer or layers. In an embodiment, the gate electrode G1 may be a single layer including Mo, for example. The first electrode CE1 of the storage capacitor Cst may be arranged in a same layer as the gate electrode G1. The first electrode CE1 may include the same material as that of the gate electrode G1.

An inter-insulating layer 115 may be included to cover the gate electrode G1 and the first electrode CE1 of the storage capacitor Cst. In an embodiment, the inter-insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

On the inter-insulating layer 115, the second electrode CE2 of the storage capacitor Cst, the source electrode S1, the drain electrode D1, and the data line DL may be arranged.

The second electrode CE2 of the storage capacitor Cst, the source electrode S1, the drain electrode D1, and the data line DL may each include a conductive material including Mo, Al, Cu, Ti, or the like, and may each be a layer or layers including the above material(s). In an embodiment, the second electrode CE2, the source electrode S1, the drain electrode D1, and the data line DL may each have a multilayered structure of Ti/Al/Ti. The source electrode S1 and the drain electrode D1 may be connected to the source area or the drain area of the semiconductor layer A1 through the contact hole, for example.

The second electrode CE2 of the storage capacitor Cst may overlap the first electrode CE1 with the inter-insulating layer 115 therebetween and may form a capacitance. In this case, the inter-insulating layer 115 may function as a dielectric layer of the storage capacitor Cst.

The second electrode CE2 of the storage capacitor Cst, the source electrode S1, the drain electrode D1, and the data line DL may be covered by an inorganic protection layer PVX.

The inorganic protection layer PVX may include a layer or layers including SiNx and SiOx. The inorganic protection layer PVX may be included to cover and protect some lines arranged on the inter-insulating layer 115. In some regions (e.g., a portion of the peripheral area) of the substrate 100, lines (not shown), which are provided together with the data line DL through the same process, may be exposed. Exposed portions of the lines may be damaged by an etchant used to pattern the pixel electrode 310 described below. As in the illustrated embodiment, the inorganic protection layer PVX covers the data line DL and at least some of the lines provided together with the data line DL, and thus, the damage to the lines in a process of patterning the pixel electrode 310 may be prevented.

A planarization layer 118 may be arranged on the inorganic protection layer PVX, and the organic light-emitting diode OLED may be arranged on the planarization layer 118.

The planarization layer 118 may be a layer or layers including an organic material and may provide a flat upper surface. In an embodiment, the planarization layer 118 may include a general-purpose polymer such as benzocyclobutene ("BCB"), polyimide, hexamethyldisiloxane ("HMDSO"), polymethylmethacrylate ("PMMA") or polystyrene ("PS"), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, or a combination thereof.

In the display area DA of the substrate 100, the organic light-emitting diode OLED is arranged on the planarization layer 118. The organic light-emitting diode OLED includes the pixel electrode 310, an intermediate layer 320 including an organic emission layer, and an opposite electrode 330.

The pixel electrode 310 may be a (semi-transmissive) light-transmissive electrode or a reflection electrode. In some embodiments, the pixel electrode 310 may include a reflection layer including Ag, Mg, Al, Pt, Pd, Au, Ni, Nd, Ir, Cr, and a combination thereof, and a transparent or translucent electrode layer disposed on the reflection layer. In an embodiment, the transparent or translucent electrode layer may include at least one of indium tin oxide ("ITO"), indium zinc oxide ("IZO"), zinc oxide (ZnO), indium oxide ($In_2O_3$), indium gallium oxide ("IGO"), and aluminum zinc oxide ("AZO"). In some embodiments, the pixel electrode 310 may include ITO/Ag/ITO.

A pixel-defining layer 119 may be arranged on the planarization layer 118, and the pixel-defining layer 119 may define an emission area of a pixel by defining an opening corresponding to each sub-pixel in the display area DA, that is, a third opening OP3, which exposes at least a central portion of the pixel electrode 310. Also, the pixel-defining layer 119 may prevent arcs, etc., from being generated at edges of the pixel electrode 310 by increasing a distance between the edges of the pixel electrode 310 and the opposite electrode 330 above the pixel electrode 310.

In an embodiment, the pixel-defining layer 119 may include at least one organic insulating material including at least one of polyimide, polyamide, acryl resin, BCB, and phenol resin and may be provided by a spin coating method, etc.

The intermediate layer 320 of the organic light-emitting diode OLED may include the organic emission layer. The organic emission layer may include an organic material including a fluorescent or phosphorescent material emitting red light, green light, blue light, or white light. The organic emission layer may include a low-molecular weight organic material or a high-molecular weight organic material, and on and under the organic emission layer, functional layers such as a hole transport layer ("HTL"), a hole injection layer ("HIL"), an electron transport layer ("ETL"), and an electron injection layer ("EIL") may be selectively arranged. The intermediate layer 320 may be arranged to respectively correspond to the pixel electrodes 310. However, the invention is not limited thereto. Various modifications may be made to the intermediate layer 320. In an embodiment, the intermediate layer 320 may include a layer that is unitary over the pixel electrodes 310, for example.

In the drawings, the intermediate layers 320 are respectively included in the first to third pixels P1 to P3, but the invention is not limited thereto. The intermediate layer 320 may be unitary over the first to third pixels P1 to P3.

In the illustrated embodiment, the organic light-emitting diodes OLED included in the first to third pixels P1 to P3 may include the organic emission layers that emit light of the same color. In an embodiment, the organic light-emitting diodes OLED included in the first to third pixels P1 to P3 may emit color of blue light, for example.

The opposite electrode 330 may be a light-transmissive electrode or a reflection electrode. In some embodiments, the opposite electrode 330 may be a transparent or translucent electrode and may include a metallic thin film having a low work function that includes Li, Ca, LiF/Ca, LiF/Al, Al, Ag, Mg, and a combination thereof. Also, a transparent conductive oxide ("TCO") film such as ITO, IZO, ZnO, or $In_2O_3$ may be further arranged on the metallic thin film. The opposite electrode 330 may be arranged over the display area DA and the peripheral area PA and may be on upper portions of the intermediate layer 320 and the pixel-defining layer 119. The opposite electrode 330 may be unitary in the organic light-emitting diodes OLED and may correspond to the pixel electrodes 310.

A spacer 119S for preventing an indentation in a mask may be further disposed on the pixel-defining layer 119. The spacer 119S may be unitary with the pixel-defining layer 119. In an embodiment, the spacer 119S and the pixel-defining layer 119 may be simultaneously provided in the same process by a half-tone mask process, for example.

Because the organic light-emitting diode OLED may be easily damaged by external moisture, oxygen, or the like, the organic light-emitting diode OLED may be covered and protected by the thin film encapsulation layer 400. The thin film encapsulation layer 400 may cover the display area DA and extend to the outside of the display area DA. The thin film encapsulation layer 400 includes at least one organic encapsulation layer and at least one inorganic encapsulation layer. In an embodiment, the thin film encapsulation layer 400 may include a first inorganic encapsulation layer 410, an organic encapsulation layer 420, and a second inorganic encapsulation layer 430, for example.

The first inorganic encapsulation layer 410 may cover the opposite electrode 330 and include $SiO_2$, $SiN_x$, and/or SiON. Although not illustrated, another layer such as a capping layer may be arranged between the first inorganic encapsulation layer 410 and the opposite electrode 330. Because the first inorganic encapsulation layer 410 is provided according to a structure thereunder, an upper surface of the first inorganic encapsulation layer 410 may not be flat. The organic encapsulation layer 420 may cover the first inorganic encapsulation layer 410, and unlike the first inorganic encapsulation layer 410, an upper surface of the organic encapsulation layer 420 may be approximately flat. In detail, a portion of the upper surface of the organic encapsulation layer 420, which corresponds to the display area DA, may be approximately flat. In an embodiment, the organic encapsulation layer 420 may include at least one of polyethylene terephthalate, polyethylene naphthalate, polycarbonate, polyimide, polyethylene sulfonate, polyoxymethylene, polyarylate, and HMDSO. In an embodiment, the second inorganic encapsulation layer 430 may cover the organic encapsulation layer 420 and include $SiO_2$, $SiN_x$, trioxanitride, and/or the like.

Although cracks appear in the thin film encapsulation layer 400 because of the above-described multilayered structure, the thin film encapsulation layer 400 may prevent such cracks from propagating between the first inorganic encapsulation layer 410 and the organic encapsulation layer 420 or between the organic encapsulation layer 420 and the second inorganic encapsulation layer 430. To this end, the generation of a path, through which external moisture, oxygen, or the like penetrates into the display area DA, may be prevented or decrease.

In the illustrated embodiment, on the upper substrate 200 facing the substrate 100, the first to third quantum conversion layers QD1 to QD3 and a light barrier pattern 210 may be arranged.

The first to third quantum conversion layers QD1 to QD3 may include quantum dots and metal nanoparticles. Referring to FIG. 4 illustrating enlarged portions of the first to third quantum conversion layers QD1 to QD3, a quantum conversion layer QD may include quantum dots 10 and metal nanoparticles 20. In the illustrated embodiment, the quantum dot 10 may correspond to any one of the first to third quantum dots 11 to 13, and the metal nanoparticle 20 may correspond to any one of the first to third metal nanoparticles 21 to 23.

The quantum dot 10 may indicate unique excitation and emission characteristics according to a material and size thereof and may convert incident light into light of a predetermined color accordingly. Various materials may be used for the quantum dot 10. In an embodiment, the quantum dot 10 may include one of a group II-VI compound, a group III-V compound, a group IV-VI compound, a group IV element, a group IV compound, and a combination thereof, for example. In an embodiment, the group II-VI compound include a binary compound including one of CdSe, CdTe, ZnS, ZnSe, ZnTe, ZnO, HgS, HgSe, HgTe, MgSe, MgS, and a combination thereof, a three-element compound including one of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, and a quaternary compound including one of HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof, for example. In an embodiment, the group III-V compound may include a binary compound including one of GaN, GaP, GaAs, GaSb, AlN, AlP, AlAs, AlSb, InN, InP, InAs, InSb, and a combination thereof, a three-element compound including one of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a combination thereof, and a quaternary compound including one of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. In an embodiment, the group IV-VI compound may include a binary compound including one of SnS, SnSe, SnTe, PbS, PbSe, PbTe, and a combination thereof, a three-element compound including one of SnSeS, SnSeTe, SnSTe, PbSeS, PbSeTe, PbSTe, SnPbS, SnPbSe, SnPbTe, and a combination thereof, and a quaternary compound including one of SnPbSSe, SnPbSeTe, SnPbSTe, and a combination thereof. In an embodiment, the group IV element may include one of Si, Ge, and a combination thereof. In an embodiment, the group IV compound may be a binary compound including one of SiC, SiGe, and a combination thereof.

In this case, the binary compound, the three-element compound, and the quaternary compound may exist in particles in uniform concentrations or in the same particle in partially different concentrations.

The quantum dot 10 may have a core-shell structure including a core and a shell. An interface of the core and the shell may have a concentration gradient in which a concentration of elements existing in the shell decreases to the center. The shell of the quantum dot 10 may function as a protection layer for maintaining semiconductor characteristics by preventing a chemical modification of the core and/or a charging layer for providing electrophoresis characteristics to the quantum dot. The shell may be a layer or layers. An interface of the core and the shell may have a concentration gradient in which a concentration of elements existing in the shell decreases to the center. Examples of the shell of the quantum dot 10 may include metal oxide, non-metal oxide, a semiconductor compound, or a combination thereof.

In an embodiment, examples of metal or non-metal oxide may include a binary compound including $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, or the like, or a three-element compound including $MgAl_2O_4$, $CoFe_2O_4$, $NiFe_2O_4$, $CoMn_2O_4$, or the like, for example, but the invention is not limited thereto.

Also, examples of the semiconductor oxide may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but the invention is not limited thereto.

In an embodiment, the quantum dot 10 may have a full width of half maximum ("FWHM") of the emission wavelength spectrum of less than or equal to about 45 nanometers (nm), preferably less than or equal to about 40 nm, and more preferably less than or equal to about 30 nm, and the color purity and color reproducibility may be improved within the above range. Also, light emitted from the quantum dot may be discharged in all directions, and thus, a viewing angle of the light may be improved.

Also, a shape of the quantum dot 10 is not specifically limited to a shape generally used in the art, and in more detail, the shape of the quantum dot 10 may be a circle, a pyramid, a multi-arm, a cubic nanoparticle, a nanotube, a nanowire, a nanofiber, a plate-shaped nanoparticle, and the like.

A diameter of the core of the quantum dot 10 may be between about 2 nm and about 10 nm. When exposed to light, the quantum dot 10 may emit light in a predetermined wavelength according to sizes of particles, types of materials, and the like, and thus, the average sizes of the quantum dots 10 respectively included in the first to third quantum conversion layers QD1 to QD3 may differ from one another. In an embodiment, as a size of the quantum dot 10 is great, the quantum dot 10 may emit light of a color having a great wavelength, for example. Therefore, sizes of the quantum dots 10 may be selected according to colors of the first to third pixels P1 to P3.

The metal nanoparticle 20 may be included to amplify the excitation and emission from the quantum dot 10. The metal nanoparticle 20 indicates a polarization phenomenon by light. The polarization phenomenon is related to the extinction of photons on a surface of the metal nanoparticles 20. A polarization distribution of the metal nanoparticles 20 may differ according to materials, shapes, and sizes of the metal nanoparticles 20. That is, the extinction of photons in a predetermined wavelength increases. The increase in the extinction of the photons increases electrons of the quantum dot 10 that is adjacent to the metal nanoparticle 20. As the number of excited electrons increases, the emission from the quantum dot 10 also increases. It may be described that such a phenomenon may result from localized surface plasmon resonance.

In an embodiment, the metal nanoparticle 20 may include, for example, at least one of Au, Ag, Al, $Al_2O_3$, Co, Cu, Cr, Pt, Ni, Fe Mo, and W.

In the illustrated embodiment, the metal nanoparticle 20 may have sides, for example, at least one corner. A size of the metal nanoparticle 20 may have a value appropriate for increasing the emission from the quantum dot 10.

The photon extinction characteristics of the metal nanoparticle 20 may be expressed as an extinction cross-section $\sigma_{Ext}$ that indicates a photo absorption ratio per unit area, and it is assumed that the shape of the metal nanoparticle 20 is a circle, the extinction cross-section $\sigma_{Ext}$ may be expressed as follows.

$$\sigma_{Ext} = \sigma_{Abs} + \sigma_{Sca} \quad (1)$$

$$\sigma_{Sca} = \frac{8\pi}{3} k^4 a^6 \left| \frac{\varepsilon - \varepsilon_m}{\varepsilon + 2\varepsilon_m} \right|$$

$$\sigma_{Abs} = 4\pi k a^3 \text{Im} \left| \frac{\varepsilon - \varepsilon_m}{\varepsilon + 2\varepsilon_m} \right|$$

where, $\sigma_{Abs}$ and $\sigma_{Sca}$ respectively indicate a scattering cross-section and an absorption cross-section, k indicates $2\pi/\lambda$, $\lambda$, indicates a wavelength, a indicates a radius of a sphere, $\varepsilon$ indicates permittivity of the metal nanoparticle 20, and $\varepsilon_m$ indicates permittivity of a surrounding material of the metal nanoparticle 20. According to Equation above, it may be predicted that there may be an optimum size representing a maximum extinction characteristic according to a wavelength of light incident to the metal nanoparticle 20.

A wavelength band of the metal nanoparticle 20 may have different wavelength bands in which the extinction mainly occurs according to the shape of the metal nanoparticle 20.

A cross-sectional shape of the metal nanoparticle 20 may be a triangle. In an embodiment, the cross-sectional shape of the metal nanoparticle 20 may be a triangle having at least one chamfered corner. When the metal nanoparticle 20 has a corner, the metal nanoparticle 20 may have different extinction characteristics, compared to a case where the metal nanoparticle 20 has a circular shape, for example. It is because the polarization densely occurs at a sharp corner. As the shape of the metal nanoparticle 20 is close to a circle, the extinction occurs in a low wavelength, and as a corner shape is sharper, the extinction occurs in a high wavelength.

A graft molecule 30 may be further disposed on a surface of the metal nanoparticle 20. The graft molecule 30 may be an alkyl group or dodecane, and in addition, various hydrocarbon groups having 6-20 carbon atoms may be used.

In an embodiment, the graft molecule 30 may be Hexane (C6H14), Heptane (C7H16), Octane (C8H18), Nonane (C9H20), Decane (C10H22), Undecane (C11H24), Dodecane (C12H26), Tridecane (C13H28), Tetradecane (C14H30), Pentadecane (C15H32), Hexadecane/Cetane (C16H34), Heptadecane (C17H36), Octadecane (C18H38), Nonadecane (C19H40), or Icosane (C20H42), for example.

Because of the graft molecules 30 disposed on the surfaces of the metal nanoparticles 20, the metal nanoparticles 20 may be separated from each other or the quantum dots 10. The metal nanoparticle 20 may be provided in plural, and the metal nanoparticles 20 may be apart from each other.

The metal nanoparticles 20 and the quantum dots 10 may be apart from each other. When gaps therebetween are not maintained, the emission from the quantum dots 10 may be quenched by the metal nanoparticles 20. The gaps between the metal nanoparticles 20 and the quantum dots 10 need to be appropriately maintained. In an embodiment, the gaps between the metal nanoparticles 20 and the quantum dots 10 may be determined, and thus, a resonance structure may be provided therebetween, for example.

The first to third quantum conversion layers QD1 to QD3 may further include various materials that help the quantum dots 10 and the metal nanoparticles 20 be mixed and appropriately distributed, in addition to the quantum dots 10 and the metal nanoparticles 20. In an embodiment, the first to third quantum conversion layers QD1 to QD3 may further include a solvent 50, a photo-initiator 60, a binder polymer 70, a dispersing agent 80, and the like, for example, but the invention is not limited thereto.

In the illustrated embodiment, the first quantum conversion layer QD1 included in the first pixel P1 may include the first quantum dot 11 and the first metal nanoparticle 21, and the second quantum conversion layer QD2 included in the second pixel P2 may include the second quantum dot 12 and the second metal nanoparticle 22. The third quantum conversion layer QD3 included in the third pixel P3 may include the third quantum dot 13 and the third metal nanoparticle 23.

In the illustrated embodiment, the organic light-emitting diodes OLED respectively included in the first to third pixels P1 to P3 may emit light in the same wavelength, and colors of the first to third pixels P1 to P3 may be determined as colors emitted by the first to third quantum dots 11 to 13. In an embodiment, the organic light-emitting diode OLED may emit blue light, the first pixel P1 may implement a red color, the second pixel P2 may implement a green color, and the third pixel P3 may implement a blue color, for example.

Therefore, the first to third quantum dots 11 to 13 may include different materials and/or have different sizes. In some embodiments, materials of the first to third quantum dots 11 to 13 may be the same, but the sizes thereof may be different. In an embodiment, a size d1 (refer to FIG. 3AB and FIG. 3BB) of the first quantum dot 11 may be greater than a size d2 (refer to FIG. 3AC and FIG. 3BC) of the second quantum dot 12, and the size d2 of the second quantum dot 12 may be greater than a size d3 (refer to FIG. 3BD) of the third quantum dot 13 (d1>d2>d3), for example.

The first to third quantum dots 11 to 13 may each be provided in plural. An average size of the first quantum dots 11 may be different from an average size of the second quantum dots 12 and an average size of the third quantum dots 13.

In some embodiments, cores of the first to third quantum dots 11 to 13 may include CdSe. In this case, an average size of the cores of the first quantum dots 11, for example, an average diameter d1, may be about 5 nm, an average diameter d2 of the cores of the second quantum dots 12 may be about 3 nm, and an average diameter d3 of the cores of the third quantum dots 13 may be about 1.7 nm.

The first to third metal nanoparticles 21 to 23 may include the same material and may have the same size and shape. The light emitted from the organic light-emitting diodes OLED may be transmitted to the first to third quantum conversion layers QD1 to QD3 and may have colors in the same wavelength. Therefore, in the illustrated embodiment, the first to third metal nanoparticles 21 to 23 may include the same material and have the same size, and thus, optimum extinction characteristics may be shown corresponding to the wavelength. Also, the average sizes of the first to third metal nanoparticles 21 to 23 may be identical.

In some embodiments, a wavelength of the light emitted from the organic light-emitting diode OLED may be blue, and the average sizes of the first to third metal nanoparticles 21 to 23 may be sizes having optimum extinction characteristics for blue light.

A first protection layer 220 may be arranged on the upper substrate 200 to cover the first to third quantum conversion layers QD1 to QD3. The first protection layer 220 may include an inorganic material such as $SiO_2$, $SiN_x$, SiON, $Al_2O_3$, $TiO_2$, $Ta_2O_5$, $HfO_2$, or $ZnO_2$. The first protection layer 220 may include an organic material such as polyimide or epoxy.

First to third color filters CF1 to CF3 and the light barrier pattern 210 may be further arranged on the upper substrate 200. The first to third color filters CF1 to CF3 may be included to realize full-color images and improve the color purity and the outdoor visibility. The first color filter CF1 may have the same color as the color from the first quantum conversion layer QD1, the second color filter CF2 may have the same color as the color from the second quantum conversion layer QD2, and the third color filter CF3 may have the same color as the color from the third quantum conversion layer QD3.

The light barrier pattern 210 may be arranged between the first to third color filters CF1 to CF3 to correspond to the non-emission area NEA. The light barrier pattern 210 may be a black matrix and may include a material for improving the color clarity and contrast. In an embodiment, the light barrier pattern 210 may include at least one of a black pigment, a black dye, and a black particle. In some embodiments, the light barrier pattern 210 may include Cr or CrOx, Cr/CrOx, Cr/CrOx/CrNy, resin (a carbon pigment, a red, green and blue ("RGB") mixture pigment), graphite, a non-cr-based material, or the like.

In an embodiment, the first to third color filters CF1 to CF3 may be disposed in a second opening OP2 defined in the light barrier pattern 210. The first to third color filters CF1 to CF3 may correspond to the emission areas EA on the upper substrate 200, and a second protection layer 230 may cover the light barrier pattern 210 and the first to third color filters CF1 to CF3.

In an embodiment, the second protection layer 230 may include an inorganic material such as $SiO_2$, $SiN_x$, SiON, $Al_2O_3$, $TiO_2$, $Ta_2O_5$, $HfO_2$, or $ZnO_2$. The second protection layer 230 may include an organic material such as polyimide or epoxy.

A filler 610 may be further arranged between the substrate 100 and the upper substrate 200. The filler 610 may function as a buffer for external impact or the like. The filler 610 may include an organic material such as methyl silicone, phenyl silicone, or polyimide. However, the invention is not limited thereto, and the filler 610 may include urethane-based resin, epoxy-based resin, acryl-based resin, which are organic sealants, silicon that is an inorganic sealant, or the like.

A light-collecting member (not shown) for collecting the light emitted from the organic light-emitting diode OLED may be further arranged between the filler 610 and the first to third quantum conversion layers QD1 to QD3.

Figure 5:
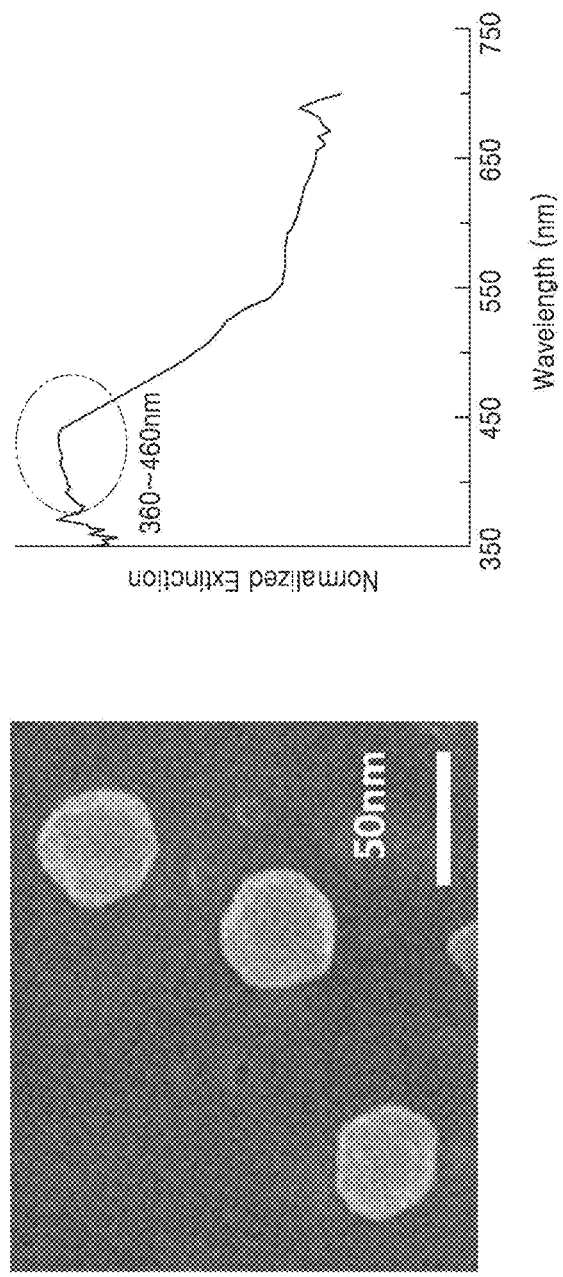

FIGS. 5 and 6 illustrate a change in photon extinction characteristics, according to shapes of metal nanoparticles.

The metal nanoparticles of FIG. 5 include silver (Ag), and shapes thereof are approximately a circle. A radius thereof may be between about 20 nm and about 40 nm. In this case, an extinction characteristic is maximized for light in a relatively wide wavelength band, that is, in a wavelength ranging from about 360 nm to about 460 nm.

The metal nanoparticles of FIG. 6 includes Ag, and shapes thereof are a triangle overall, and a size of one side may be between about 70 nm and about 130 nm. In this case, an extinction characteristic according to the wavelength is the maximum for light in a wavelength ranging from about 440 nm to about 460 nm. In FIG. 6, when the shapes of the metal nanoparticles are circles, the extinction characteristics are the maximum in a relatively narrow wavelength band.

It may indicate that when the shapes of the metal nanoparticles are polygons having multiple sides instead of spheres, the metal nanoparticles react only to the light from the organic light-emitting diodes OLED without any influence of external light, and thus, the visibility of a display apparatus may be improved.

That is, when the light from the organic light-emitting diodes OLED is blue light in a range from about 440 nm and about 460 nm, the first to third metal nanoparticles 21 to 23 may include Ag and have triangular shapes of which one side has a length having a range between about 70 nm and about 130 nm.

FIGS. 7A to 7J schematically illustrate an embodiment of shapes of metal nanoparticles that may be included in a quantum conversion layer.

Referring to FIGS. 7A to 7E, shapes of the metal nanoparticles 20 may each be a polygon of which a cross-section has multiple sides. That is, the metal nanoparticles 20 may include sharp corners. In an embodiment, cross-sectional shapes of the metal nanoparticles 20 may be various polygons such as a square, a pentagon, a hexagon, a heptagon, and an octagon, for example. In this case, corners of a polygon may be rounded. The metal nanoparticles 20 may include the above-described cross-sections upper or lower surfaces thereof, and may each have a pillar shape having a small thickness. As the metal nanoparticles 20 have sharp corners, the polarization may appear dense. Accordingly, light extinction characteristics may be the maximum in a short-range wavelengths.

Figure 7A:
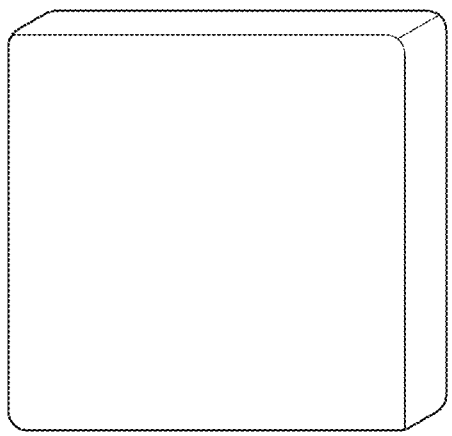
FIGS. 7A to 7J schematically illustrate an embodiment of shapes of metal nanoparticles that may be included in a quantum conversion layer.
Figure 7B:
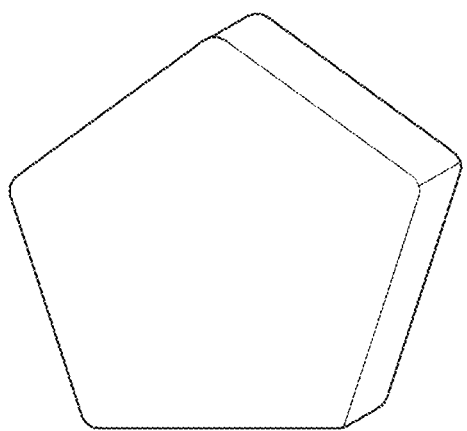
Figure 7C:
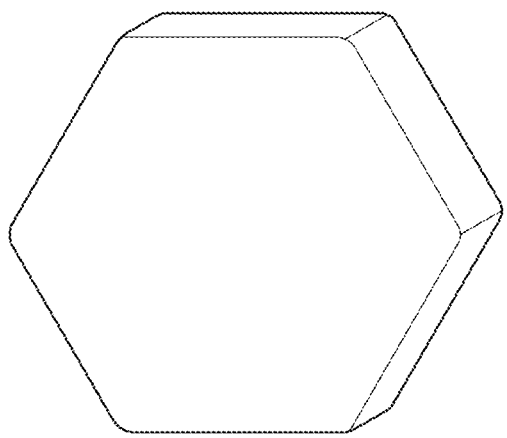
Figure 7D:
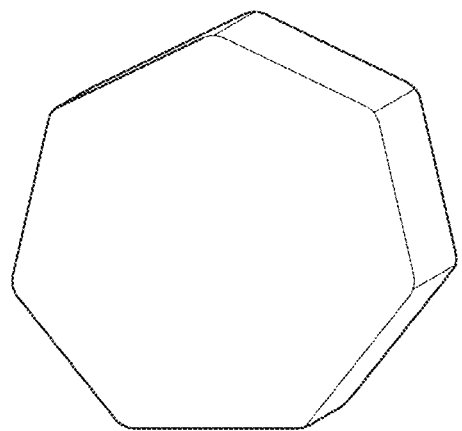
Figure 7E:
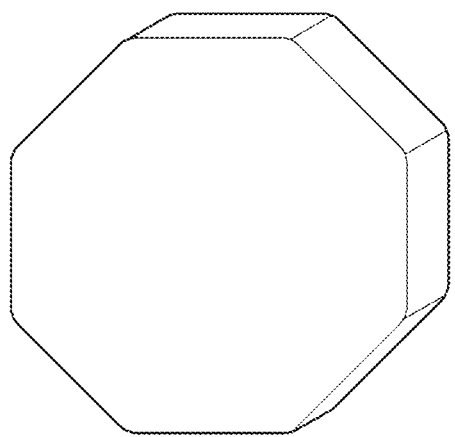
Figure 7F:
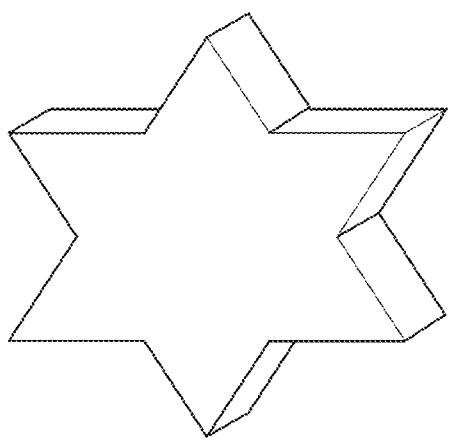
Figure 7G:
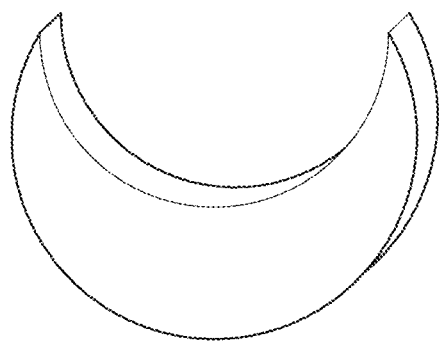

As illustrated in FIGS. 7F and 7G, cross-sectional shapes of the metal nanoparticles 20 may be a star, a crescent moon, and the like. Because the metal nanoparticles 20 having the above cross-sectional shapes have sharp corners, the polarization may appear dense.

Figure 7H:
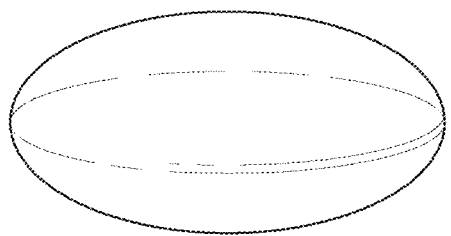
Figure 7I:

Referring to FIGS. 7H and 7I, the shapes of the metal nanoparticles 20 may be long oval in a direction or a nanorode. As described, because the polarization is dense even when the metal nanoparticle 20 is elongated in one direction, the light extinction characteristics may be maximized in a short-range wavelength.

Figure 7J:
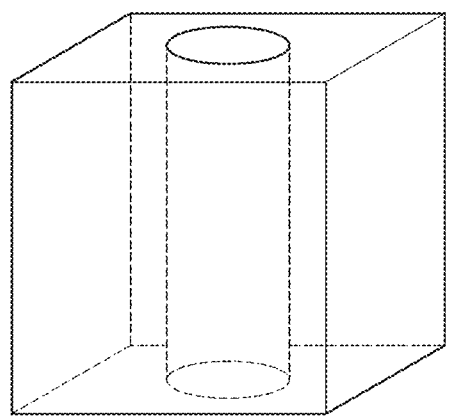

Referring to FIG. 7J, the shape of the metal nanoparticle 20 may be a hollow nanocage. Such a shape includes many sharp parts, and thus, the light extinction characteristics may be maximized in a short-range wavelength.

Figure 8:
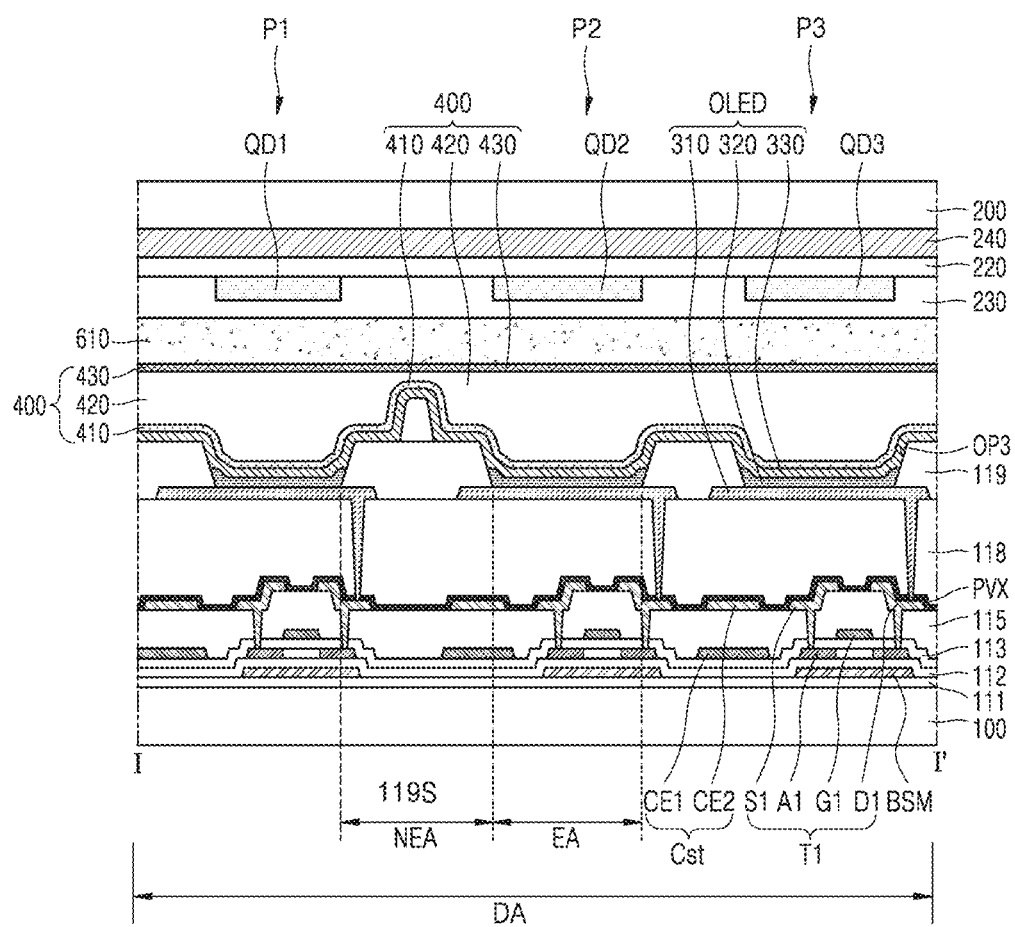
FIG. 8 is a schematic cross-sectional view of an embodiment of a display apparatus.

FIG. 8 is a schematic cross-sectional view of an embodiment of a display apparatus. In FIG. 8, the same reference symbols as those in FIG. 3BA denote like elements, and repeated descriptions thereof will be omitted.

Referring to FIG. 8, the display apparatus in the illustrated embodiment includes the first quantum conversion layer QD1 included in the first pixel P1, the second quantum conversion layer QD2 included in the second pixel P2, and the third quantum conversion layer QD3 included in the third pixel P3. The first quantum conversion layer QD1 includes first quantum dots and the first metal nanoparticles, and the second quantum conversion layer QD2 includes the second quantum dots and the second metal nanoparticles. The third quantum conversion layer QD3 includes the third quantum dots and the third metal nanoparticles. In this case, the average size of the first quantum dots is different from that of the second quantum dots, and the average size of the first metal nanoparticles is similar to that of the second metal nanoparticles. Also, the first metal nanoparticles and the second metal nanoparticles may have the same shape.

The organic light-emitting diodes OLED included in the first to third pixels P1 to P3 may emit the light of the same color. In an embodiment, the organic light-emitting diodes OLED may emit the blue light, for example. Accordingly, the first to third metal nanoparticles may include materials and have shapes in which the extinction characteristics are maximized for blue light. In some embodiments, the first to third metal nanoparticles may include Ag and may have sharp corners.

The first quantum conversion layer QD1 may emit the red light because of the first quantum dots, and the second quantum conversion layer QD2 may emit the green light because of the second quantum dots. The third quantum conversion layer QD3 may emit the blue light because of the third quantum dots. In this case, the average size of the first quantum dots may be greater than that of the second quantum dots. The average size of the second quantum dots may be greater than that of the third quantum dots. That is, as the quantum conversion layer emits light of a color of a long wavelength, sizes of quantum dots included in the quantum conversion layer may be great.

In the illustrated embodiment, a polarization layer 240 may be arranged between the first to third quantum conversion layers QD1 to QD3 and the upper substrate 200, instead of the first to third color filters CF1 to CF3 (refer to FIG. 3BA). The polarization layer 240 may be deposited on a lower surface of the upper substrate 200 and laminated in a form of a polarization film.

The polarization layer 240 may be included to realize full-color images and improve the color purity and the outdoor visibility.

The polarization layer 240 may polarize light, which is incident from a light source (not shown), in a direction that is the same as a polarization axis. In some embodiments, the polarization layer 240 may be provided by including a polarizer and/or a dichroic dye in a poly vinyl alcohol ("PVA") film. The dichroic dye may be iodine molecules and/or dye molecules.

In some embodiments, the polarization layer 240 may be provided by stretching the PVA film in a direction and soaking the PVA film in a solution including iodine molecules and/or dye molecules. In this case, the iodine molecules and/or dye molecules may be arranged side by side in a stretch direction. Because the iodine and/or dye molecules are dichroic, the iodine and/or dye molecules may absorb light vibrating in the stretch direction and may penetrate light vibrating in a direction perpendicular to the stretch direction.

On and/or under the polarization layer 240, various functional layers (not shown) may be further arranged to prevent the penetration of external air, moisture, and the like into the polarization layer 240 or complement a mechanical strength. In an embodiment, the functional layer may include at least one of PVA, poly vinylindene chloride ("PVDC"), ethylene vinyl alcohol ("EVOH"), cyclo olefin polymer ("COP"), and tri-acetyl cellulous ("TAC"). The functional layer may be provided in plural. The functional layer and the polarization layer 240 may adhere to each other by an adhesive member.

Figure 9:
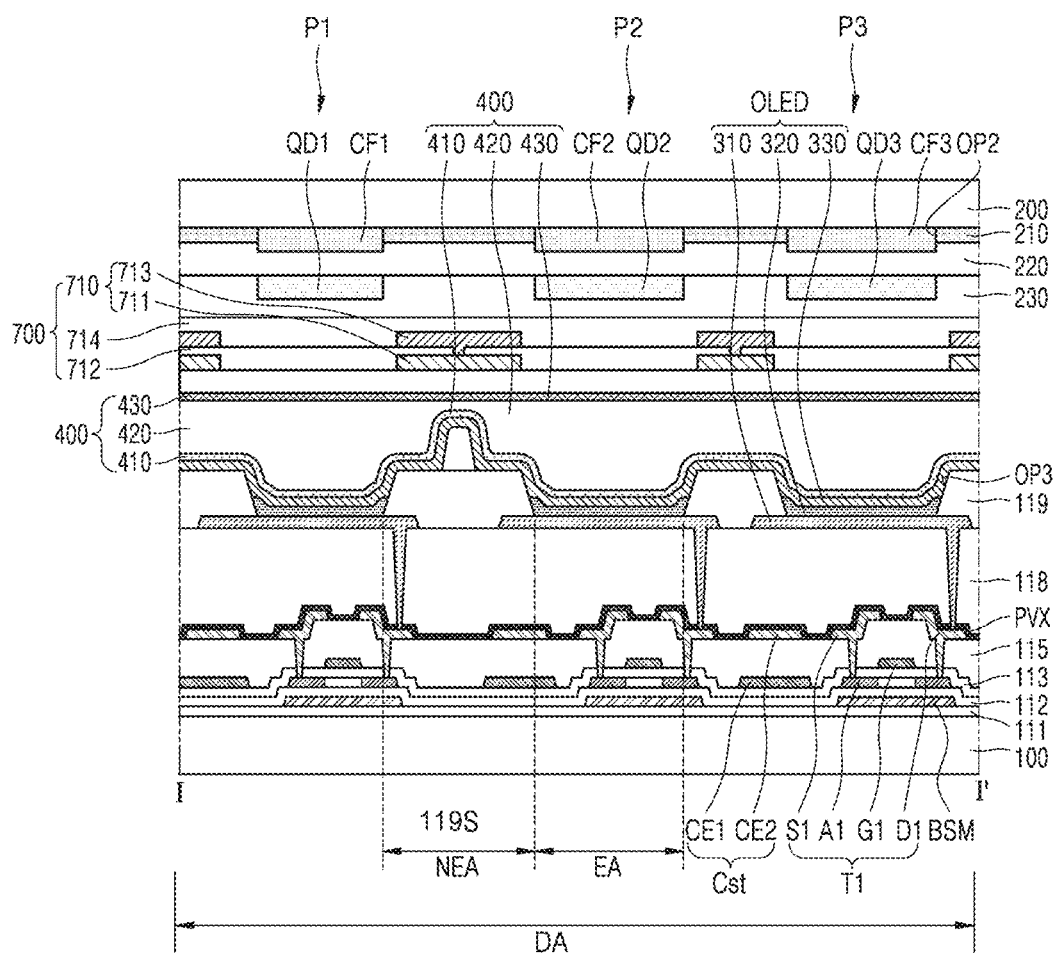
FIG. 9 is a schematic cross-sectional view of an embodiment of a display apparatus.

FIG. 9 is a schematic cross-sectional view of an embodiment of a display apparatus. In FIG. 9, the same reference symbols as those in FIG. 3BA denote like elements, and repeated descriptions thereof will be omitted.

Referring to FIG. 9, the display apparatus in the illustrated embodiment includes the first quantum conversion layer QD1 included in the first pixel P1, the second quantum conversion layer QD2 included in the second pixel P2, and the third quantum conversion layer QD3 included in the third pixel P3. The first quantum conversion layer QD1 includes first quantum dots and the first metal nanoparticles, and the second quantum conversion layer QD2 includes the second quantum dots and the second metal nanoparticles. The third quantum conversion layer QD3 includes the third quantum dots and the third metal nanoparticles. In this case, the average size of the first quantum dots is different from that of the second quantum dots, and the average size of the first metal nanoparticles is similar to that of the second metal nanoparticles. Also, the first metal nanoparticles and the second metal nanoparticles may have the same shape.

The organic light-emitting diodes OLED included in the first to third pixels P1 to P3 may emit the light of the same color. In an embodiment, the organic light-emitting diodes OLED may emit the blue light, for example. Accordingly, the first to third metal nanoparticles may include materials and have shapes in which the extinction characteristics are maximized for blue light. In some embodiments, the first to third metal nanoparticles may include Ag and may have sharp corners.

The first quantum conversion layer QD1 may emit the red light because of the first quantum dots, and the second quantum conversion layer QD2 may emit the green light because of the second quantum dots. The third quantum conversion layer QD3 may emit the blue light because of the third quantum dots. In this case, the average size of the first quantum dots may be greater than that of the second quantum dots. The average size of the second quantum dots may be greater than that of the third quantum dots. That is, as the quantum conversion layer emits light of a color of a long wavelength, sizes of quantum dots included in the quantum conversion layer may be great.

In the illustrated embodiment, a touch screen layer 700 may be arranged on the thin film encapsulation layer 400.

The touch screen layer 700 may be of, for example, a capacitance type. The touch screen layer 700 may detect a change in a mutual capacitance, which is generated between the touch electrodes 710 of the touch screen layer 700 while a cover layer (not shown) is touched, and thus may determine whether a portion of the cover layer is touched. In an alternative embodiment, the touch screen layer 700 may determine touches in various manners. In an embodiment, the touch screen layer 700 may detect a change in a capacitance between the touch electrode 710 and the opposite electrode 330 and determine there is any touch.

In an embodiment, the touch screen layer 700 may have a structure in which a first touch conductive layer 711, a first insulating layer 712, a second touch conductive layer 713, and a second insulating layer 714 are sequentially stacked. The touch electrode 710 may include the first touch conductive layer 711 and the second touch conductive layer 713.

In some embodiments, the first touch conductive layer 711 and the second touch conductive layer 713 may function as sensors. In an embodiment, the first insulating layer 712 may include a via hole exposing an upper surface of the first touch conductive layer 711, and the first touch conductive layer 711 and the second touch conductive layer 713 may be connected to each other through the via hole, for example. As described above, according to the use of the first touch conductive layer 711 and the second touch conductive layer 713, a resistance of the touch electrode 710 may decrease, and a response speed of the touch screen layer 700 may be improved.

In some embodiments, the touch electrode 710 may have a mesh structure to allow the light emitted from the organic light-emitting diode OLED to pass through. Accordingly, the first touch conductive layer 711 and the second touch conductive layer 713 of the touch electrode 710 may not overlap the emission area of the organic light-emitting diode OLED.

The first touch conductive layer 711 and the second touch conductive layer 713 may each be a layer or layers including a conductive material having the great conductivity. In an embodiment, the first touch conductive layer 711 and the second touch conductive layer 713 may each be a transparent conductive layer and may be a layer or layers including a conductive material such as Al, Cu, and/or Ti, for example. The transparent conductive layer may include TCO such as ITO, IZO, ZnO, or ITZO. In addition, the transparent conductive layer may include a conductive polymer such as poly(3,4-ethylenedioxythiophene) ("PEDOT"), a metal nanowire, graphene, and the like. In some embodiments, the first touch conductive layer 711 and the second conductive layer 713 may each have a stack structure of Ti/Al/Ti.

The first insulating layer 712 and the second insulating layer 714 may each include an inorganic material or an organic material. In an embodiment, the inorganic material may be at least any one of $SiN_x$, aluminum nitride (AlN), zirconium nitride (ZrN), titanium nitride (TiN), hafnium nitride (HfN), tantalum nitride (TaN), $SiO_2$, $Al_2O_3$, $TiO_2$, tin oxide ($SnO_2$), cerium oxide ($CeO_2$), and SiON. In an embodiment, the organic material may be at least any one of acryl-base resin, methacrylic resin, polyisoprene, vinyl-base resin, epoxy-based resin, urethane-base resin, cellulose-base resin, and perylene-base resin.

Although not shown, a touch buffer layer may be further arranged between the thin film encapsulation layer 400 and the touch screen layer 700. The touch buffer layer may prevent damage to the thin film encapsulation layer 400 and may block an interference signal that may be generated while the touch screen layer 700 is driven. In an embodiment, the touch buffer layer may include an inorganic material such as $SiO_2$, $SiN_x$, SiON, $Al_2O_3$, AlN, $TiO_2$, or TiN or an organic material such as polyimide, polyester, or acryl, and may be a laminate including the above materials.

The touch buffer layer and/or the touch screen layer 700 may be directly disposed on the thin film encapsulation layer 400 by deposition, etc., and thus, there is no need for a separate adhesive layer on the thin film encapsulation layer 400. Accordingly, a thickness of the display apparatus may decrease.

In another embodiment, the touch screen layer 700 may not be disposed on an upper portion of the thin film encapsulation layer 400, but may be disposed on an upper portion of the upper substrate 200. Also, various changes may be made. In an embodiment, a touch panel (not shown), not the touch screen layer 700, may adhere to the upper portion of the upper substrate 200 by an adhesive layer, for example.

Embodiments that may be applied to the embodiments of the invention have been described. Such embodiments may be implemented as separate embodiments or a combination thereof.

As described above, a display apparatus according to one or more embodiments includes a quantum conversion layer including a quantum dot and a metal nanoparticle, and thus, high-quality images may be realized.

It should be understood that embodiments described herein should be considered in a descriptive sense only and not for purposes of limitation. Descriptions of features or features within each embodiment should typically be considered as available for other similar features or features in other embodiments. While one or more embodiments have been described with reference to the drawing figures, it will be understood by those of ordinary skill in the art that various changes in form and details may be made therein without departing from the spirit and scope of the invention.

What is claimed is:

1. A display apparatus comprising:
   a first pixel, a second pixel, and a third pixel which emit light of different colors;
   a first quantum conversion layer arranged corresponding to an emission area of the first pixel and comprising a plurality of first quantum dots and a plurality of first metal nanoparticles; and
   a second quantum conversion layer arranged corresponding to an emission area of the second pixel and comprising a plurality of second quantum dots and a plurality of second metal nanoparticles,
   wherein the plurality of first quantum dots has an average size different from an average size of the plurality of second quantum dots, and
   the plurality of first metal nanoparticles has an average size identical to an average size of the plurality of second metal nanoparticles, and outer shapes of the plurality of first metal nanoparticles and the plurality of second metal nanoparticles have sharper corners than virtual outer spherical shapes.

2. The display apparatus of claim 1, further comprising:
   a first color filter arranged corresponding to the first pixel;
   a second color filter arranged corresponding to the second pixel; and
   a third color filter arranged corresponding to the third pixel, wherein the first, second, and third color filters emit light of different colors.

3. The display apparatus of claim 1, further comprising:
   a substrate; and an opposite substrate arranged corresponding to the substrate and comprising a polarization layer.

4. The display apparatus of claim 1, further comprising:
a thin film encapsulation layer covering the first pixel, the second pixel, and the third pixel and comprising at least one inorganic encapsulation layer and at least one organic encapsulation layer; and
a touch screen layer arranged on a surface of the thin film encapsulation layer facing the first and second quantum conversion layers.

5. The display apparatus of claim 1, wherein the first pixel displays a color of a longer wavelength than a color of the second pixel, and
the average size of the plurality of first quantum dots is greater than the average size of the plurality of second quantum dots.

6. The display apparatus of claim 1, wherein the plurality of first metal nanoparticles and the plurality of second metal nanoparticles have polygonal shapes with rounded corners.

7. The display apparatus of claim 1, wherein the plurality of first metal nanoparticles and the plurality of second metal nanoparticles each have a star, a crescent moon, a nanorod, a hollow nanocage, or an oval shape.

8. The display apparatus of claim 1, wherein the plurality of first metal nanoparticles and the plurality of first quantum dots are arranged apart from each other, and
the plurality of second metal nanoparticles and the plurality of second quantum dots are arranged apart from each other.

9. The display apparatus of claim 1, wherein graft molecules are further arranged on surfaces of the plurality of first metal nanoparticles and the plurality of second metal nanoparticles.

10. The display apparatus of claim 1, wherein the plurality of first metal nanoparticles and the plurality of second metal nanoparticles each comprise at least one of Au, Ag, Al, $Al_2O_3$, Co, Cu, Cr, Pt, Ni, Fe, Mo, and W.

11. The display apparatus of claim 1, further comprising a third quantum conversion layer arranged corresponding to the third pixel and comprising a plurality of third quantum dots and a plurality of third metal nanoparticles,
wherein an average size of the plurality of third quantum dots is different from the average size of the plurality of first quantum dots and the average size of the plurality of second quantum dots, and
an average size of the plurality of third metal nanoparticles is identical to the average size of the plurality of first metal nanoparticles and the average size of the plurality of second metal nanoparticles.

12. The display apparatus of claim 1, wherein the first pixel, the second pixel, and the third pixel each comprise an organic light-emitting diode.

13. The display apparatus of claim 12, wherein the organic light-emitting diodes of the first, second, and third pixels emit blue light.

14. A display apparatus comprising:
a first pixel, a second pixel, and a third pixel arranged on a substrate and respectively comprising organic light-emitting diodes which emit a same color light;
a thin film encapsulation layer covering the organic light-emitting diodes; and
a first quantum conversion layer, a second quantum conversion layer and a transmission window arranged on the thin film encapsulation layer, the first quantum conversion layer corresponding to the first pixel, the second quantum conversion layer corresponding to the second pixel, and the transmission window corresponding to the third pixel,
wherein the first quantum conversion layer comprises a plurality of first quantum dots and a plurality of first metal nanoparticles,
the second quantum conversion layer comprises a plurality of second quantum dots having an average size different from an average size of the plurality of first quantum dots, and a plurality of second metal nanoparticles having an average size identical to an average size of the plurality of first metal nanoparticles within an error range, and
outer shapes of the plurality of first metal nanoparticles and the plurality of second metal nanoparticles have sharper corners than virtual outer spherical shapes.

15. The display apparatus of claim 14, wherein the organic light-emitting diodes of the first, second, and third pixels emit the blue light.

16. The display apparatus of claim 14, wherein the thin film encapsulation layer comprises at least one inorganic encapsulation layer and at least one organic encapsulation layer.

17. The display apparatus of claim 14, wherein the plurality of first metal nanoparticles and the plurality of second metal nanoparticles comprise silver (Ag) and have triangular shapes.

18. The display apparatus of claim 14, wherein the transmission window comprises scattered particles.

19. The display apparatus of claim 14, further comprising:
a touch conductive layer arranged on a surface of the thin film encapsulation layer facing the first and second quantum conversion layers.

20. The display apparatus of claim 14, further comprising:
a first color filter arranged corresponding to the first quantum conversion layer;
a second color filter arranged corresponding to the second quantum conversion layer; and
a third color filter arranged corresponding to the transmission window.

* * * * *